(12) United States Patent
Ohno

(10) Patent No.: US 8,815,646 B2
(45) Date of Patent: Aug. 26, 2014

(54) SEMICONDUCTOR DEVICE ADAPTED TO IMPROVE HEAT DISSIPATION

(75) Inventor: Hirotaka Ohno, Miyoshi (JP)

(73) Assignee: Toyota Jidosha Kabushiki Kaisha, Toyota-Shi (JP)

( * ) Notice: Subject to any disclaimer, the term of this patent is extended or adjusted under 35 U.S.C. 154(b) by 39 days.

(21) Appl. No.: 13/475,449

(22) Filed: May 18, 2012

(65) Prior Publication Data
US 2012/0228776 A1  Sep. 13, 2012

Related U.S. Application Data

(63) Continuation of application No. PCT/JP2010/058056, filed on May 12, 2010.

(51) Int. Cl.

| | | |
|---|---|---|
| *H01L 21/00* | (2006.01) | |
| *H01R 9/00* | (2006.01) | |
| *H01L 23/495* | (2006.01) | |
| *H01L 23/00* | (2006.01) | |
| *H01L 23/047* | (2006.01) | |
| *H01L 23/433* | (2006.01) | |
| *H01L 23/31* | (2006.01) | |

(52) U.S. Cl.
CPC ............. *H01L 24/04* (2013.01); *H01L 23/047* (2013.01); *H01L 23/4334* (2013.01); *H01L 23/49517* (2013.01); *H01L 24/32* (2013.01); *H01L 23/3142* (2013.01); *H01L 24/33* (2013.01)
USPC ........... 438/119; 438/122; 438/612; 361/773; 361/813; 257/672; 257/707; 257/713; 257/717; 257/720

(58) Field of Classification Search
CPC ... H01L 24/04; H01L 23/047; H01L 23/4334; H01L 23/49517; H01L 24/32; H01L 23/3142; H01L 24/33
See application file for complete search history.

(56) References Cited

U.S. PATENT DOCUMENTS

| | | | | |
|---|---|---|---|---|
| 6,703,707 | B1 * | 3/2004 | Mamitsu et al. | 257/718 |
| 6,967,404 | B2 * | 11/2005 | Mamitsu et al. | 257/718 |
| 6,992,383 | B2 * | 1/2006 | Mamitsu et al. | 257/718 |
| 2007/0216013 | A1 * | 9/2007 | Funakoshi et al. | 257/691 |
| 2010/0007026 | A1 * | 1/2010 | Shikano | 257/773 |
| 2012/0267774 | A1 * | 10/2012 | Ewe et al. | 257/734 |

FOREIGN PATENT DOCUMENTS

| | | | |
|---|---|---|---|
| JP | 63-296345 | A | 12/1988 |
| JP | 11-054673 | A | 2/1999 |
| JP | 2001-308237 | A | 11/2001 |
| JP | 2002-158328 | A | 5/2002 |

(Continued)

OTHER PUBLICATIONS

International Search Report of PCT/JP2010/058056 mailed Jul. 20, 2010.

*Primary Examiner* — Alonzo Chambliss
(74) *Attorney, Agent, or Firm* — Kenyon & Kenyon LLP

(57) ABSTRACT

A semiconductor device is formed by molding using a resin with a semiconductor element and one or two heat dissipating plates contained therein, said one or two heat dissipating plates being disposed to face one surface or both the surfaces of the semiconductor element. An intermediate layer is formed by spraying a metal powder to the semiconductor element and to one of or both of the heat dissipating plates using a cold spray method, and the semiconductor element and the heat dissipating plate are bonded together using a solder with the intermediate layer therebetween.

20 Claims, 8 Drawing Sheets

(56) References Cited

FOREIGN PATENT DOCUMENTS

| JP | 2003-110064 A | 4/2003 |
|----|---------------|--------|
| JP | 2004-083964 A | 3/2004 |
| JP | 2004-281977 A | 10/2004 |
| JP | 2006-319146 A | 11/2006 |
| JP | 2008-124158 A | 5/2008 |
| JP | 2008-300455 A | 12/2008 |
| JP | 2010-062490 A | 3/2010 |

* cited by examiner

SEMICONDUCTOR DEVICE ADAPTED TO IMPROVE HEAT DISSIPATION

CROSS-REFERENCE TO RELATED APPLICATIONS

This application is a continuation application based upon and claims the benefit of the prior PCT International Patent Application No. PCT/JP2010/058056 filed on May 12, 2010, the entire contents of which are incorporated herein by reference.

TECHNICAL FIELD

The present invention relates to a semiconductor device adapted to improve heat dissipation or release property of the heat generated from a semiconductor element.

BACKGROUND ART

In a large-current semiconductor device, a semiconductor element is a heating body and thus generates a large amount of heat during use. Therefore, the configuration that heat sink or dissipating plates are joined respectively to both surfaces of a semiconductor element has been proposed to improve heat dissipation property. FIG. 15 is a sectional view of a conventional semiconductor device provided with heat dissipating plates on both surfaces of a semiconductor element. A semiconductor device 100 is configured such that a semiconductor element 101 is held between a first electrode 102 and a second electrode 103 and further a block electrode 104 is placed between the semiconductor element 101 and the first electrode 102. The semiconductor element 101, first electrode 102, second electrode 103, and block electrode 104 which are laid one on another are respectively joined to one another through solder, thus forming solder layers 105.

The first electrode 102 and second electrode 103 are placed as an emitter electrode and a collector electrode which are main electrodes of the semiconductor element 101 and also function as heat dissipating plates. Those electrodes 102 and 103 are therefore made of metal providing good electric conductivity and heat conductivity, such as copper and aluminum. The block electrode 104 is similarly made of metal providing good electric conductivity and heat conductivity, such as copper and aluminum. Those first electrode 102 and second electrode 103 are connected respectively to main electrode terminals not shown. A control electrode terminal 111 is connected to the semiconductor element 101 through a bonding wire 112. Those components are wholly molded with resin 108.

RELATED ART DOCUMENTS

Patent Documents

Patent Document 1: JP 2003-110064A

DISCLOSURE OF THE INVENTION

Problems to be Solved by the Invention

In the case where the semiconductor element 101 is a power element such as IGBT, the semiconductor element 101 generates a large amount of heat. Therefore, the semiconductor device 100 is required to dissipate heat as efficiently as possible. In the semiconductor device 100, however, the solder layers 105 joining the semiconductor element 101 to the first electrode 102 and others could be factors that disturb heat dissipation. The reason comes from the following. Solder used for the solder layers 105 is tin alloy but the heat conductivity thereof is only about a sixth that of copper. Further, the thickness of each solder layer 105 is as much as about 0.1 mm to 0.4 mm. Thus, the influence of the solder layers 105 could not be disregarded. In case voids are formed in the solder layers 105, such voids may disturb heat dissipation.

The present invention has been made to solve the above problems and has a purpose to provide a semiconductor device adapted to improve heat dissipation property.

Means of Solving the Problems

To achieve the above purpose, one aspect of the invention provides a semiconductor device in which a semiconductor element, a first electrode and a second electrode placed holding the semiconductor element from both sides, and a block electrode placed between the semiconductor element and the first electrode are molded with resin, wherein the block electrode is formed of metal powder sprayed onto the semiconductor element or the first electrode by a cold spray method, and the block electrode is joined to the first electrode or the semiconductor element through solder.

Another aspect of the invention provides a semiconductor device in which a semiconductor element and one or two heat dissipating plates placed to face one or both surfaces of the semiconductor element are molded with resin, wherein the semiconductor element is provided with a metal layer to protect the semiconductor element from shocks by cold spray, and the intermediate layer is formed of metal powder sprayed on the metal layer by a cold spray method.

Another aspect of the invention provides a semiconductor device in which a semiconductor element and one or two heat dissipating plates placed to face one or both surfaces of the semiconductor element are molded with resin, and an intermediate layer is formed of metal powder sprayed on the semiconductor element by a cold spray method, wherein the intermediate layer is provided together with a solder layer joining the semiconductor element to the heat dissipating plate placed to face one surface of the semiconductor element, and the intermediate layer is coated on the heat dissipating plate so that one protrusion or two or more protrusions, each being of a columnar shape, are provided in the solder layer.

Effects of the Invention

According to a semiconductor device of the invention, an intermediate layer is formed by a cold spray method, and part of solder layers to be provided between a semiconductor element and heat dissipating plates is omitted, thereby improving heat dissipation. Further, since the heat passes through the intermediate layer located in the solder layer, the heat dissipation property can be improved.

MODE FOR CARRYING OUT THE INVENTION

Figure 1:
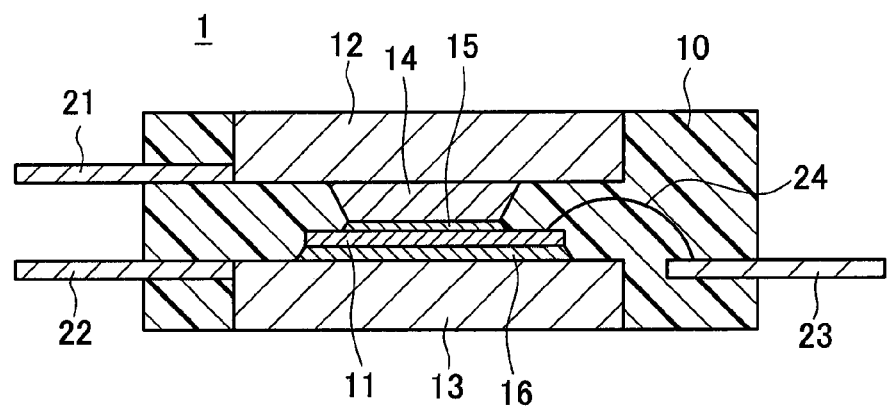
FIG. 1 is a cross sectional view of a semiconductor device of a first embodiment.

A detailed description of a preferred embodiment of a semiconductor device embodying the present invention will now be given referring to the accompanying drawings. FIG. 1 is a cross sectional view showing a semiconductor device of the first embodiment. This semiconductor device 1 is configured, as with the conventional example, such that a semiconductor element 11 is held between a first electrode 12 and a second electrode 13, and further a block electrode 14 is placed between the semiconductor element 11 and the first electrode 12. The first electrode 12 and the second electrode 13 are provided as an emitter electrode and a collector electrode which are main electrodes of the semiconductor element 11, and also function as heat sink or dissipating plates. Those electrodes 12 and 13 are therefore made of metal providing good electric conductivity and heat conductivity, such as copper and aluminum.

On the other hand, the block electrode 14 is integrally formed on the first electrode 12 by a cold spray method. No solder layer is present between the first electrode 12 and the block electrode 14. In this embodiment, solder layers 15 and 16 are provided respectively between the semiconductor element 11 and the block electrode 14 and between the semiconductor element 11 and the second electrode 13 to join them. Main electrode terminals 21 and 22 are connected respectively to the first electrode 12 and the second electrode 13. A control electrode terminal 23 is connected to the semiconductor element 11 through a bonding wire 24. Those components are wholly molded with resin 10. The block electrode 14 is one example of an intermediate layer recited in claims.

Figure 2:
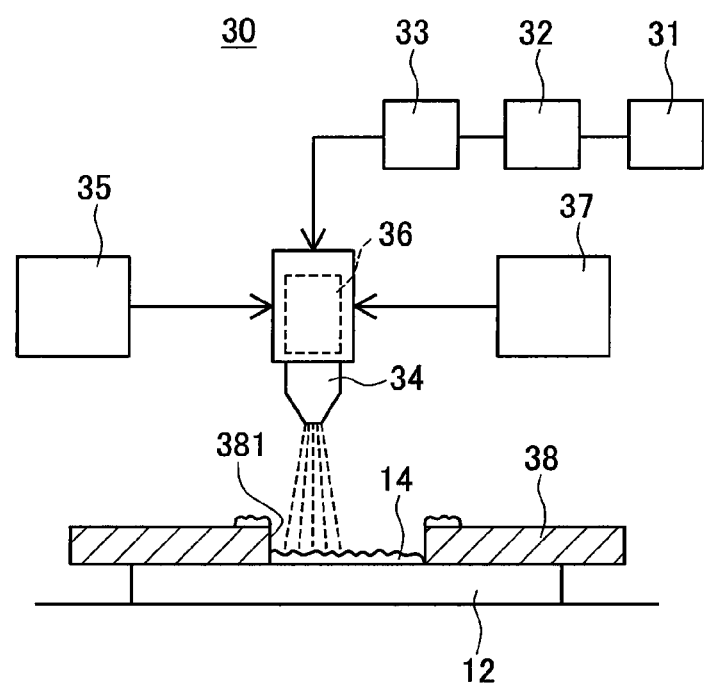
FIG. 2 is a conceptual diagram showing a configuration of a coating device for carrying out a cold spray method.

The block electrode 14 is formed as a cold spray layer having a height of about 0.5 mm to 2 mm on the first electrode 12 which is an emitter electrode by a cold spray method. FIG. 2 is a conceptual diagram showing a configuration of a coating device for carrying out the cold spray method. The coating device 30 includes a compressor 31 for supplying compressed gas. This compressed gas supplied from the compressor 31 is heated in a heating unit 32 and then injected from a nozzle 34 via a pressure regulating valve 33.

Further, the nozzle 34 is supplied with copper powder from a powder tank 35. The nozzle 34 is also provided with a heater 36 to further heat the copper powder. A drive unit 37 is provided to move the nozzle 34 horizontally in order to spray the copper powder onto a specified region to form a coat or layer thereon. The present embodiment uses copper powder (the same applies to each of the following embodiments). This is because the block electrode 14 can provide the electric conductivity and heat conductivity equivalent to those of the first electrode 12 and the second electrode 13. Metal powder to be sprayed by cold spray may be selected from any material as well as copper, but preferably a material having higher heat conductivity than solder.

When the block electrode 14 is to be formed by the coating device 30, a masking plate 38 is placed on the first electrode 12. The masking plate 38 is formed with a frame opening 381 corresponding to a size of a region to be coated. The nozzle 34 is supplied with copper powder having an average particle diameter of 5 μm to 60 μm from the powder tank 35 and then the copper powder is heated by the heater 36. Further, the compressed gas supplied from the compressor 31 and then heated is supplied into the nozzle 34.

The copper powder in a solid phase state having been heated to 50° C. to 200° C. is sprayed swiftly together with the compressed gas onto the surface of the first electrode 12 through the nozzle 34. A jet of copper powder in a solid state from the nozzle 34 collides against the first electrode 12 at high velocities ranging from acoustic velocity to supersonic velocity, so that the copper powder is plastically deformed, sticking to the first electrode 12, thereby forming a coat thereon. When the copper powder collides, kinetic energy transforms into heat energy. Therefore, powder surfaces exceed a melting point depending on the kinds of materials and bond to the first electrode 12, thereby providing high bonding or adhesion strength. By repeating the horizontal movement of the nozzle 34 to spray the copper powder all over the region to be coated, the block electrode 14 with a predetermined thickness is coated on the first electrode 12.

The first electrode 12 on which the block electrode 14 is formed by the cold spray method is then put in a furnace and subjected to a heat treatment under an inert gas atmosphere (e.g., an atmosphere such as argon gas, helium gas, and nitrogen gas) in a temperature range of 200° C. to 700° C. The block electrode 14 subjected to the heat treatment can have a higher heat conductivity because oxides (oxide films/layers) in grain boundaries between copper particles (copper powder) stuck and deposited as a coat are diffused in the particles.

Figure 3:
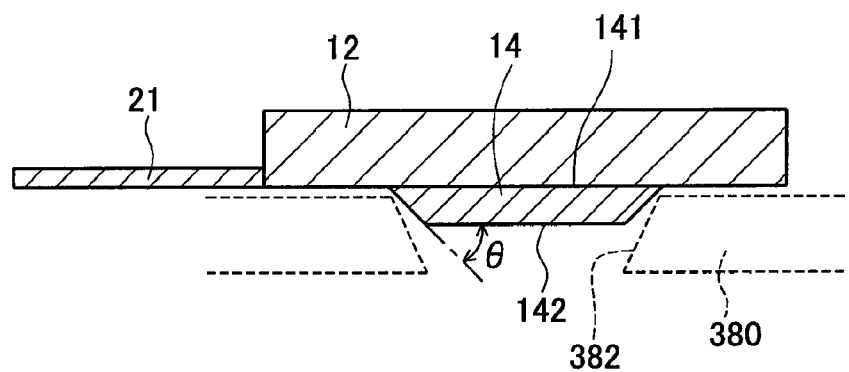
FIG. 3 is a sectional view of a first electrode and a block electrode of the semiconductor device in the first embodiment.

Meanwhile, the block electrode 14 in the present embodiment, which is not a rectangular parallelepiped shape as shown in the conventional example, is formed in a trapezoidal shape in side view having a wide surface 141 and a narrow surface 142 as top and bottom surfaces as shown in FIG. 3. For forming this block electrode 14, a masking plate 380 indicated with a broken line in FIG. 3 is used instead of the masking plate 38 shown in FIG. 2. The masking plate 380 has a slant surface so that a frame opening 382 has an open area wider toward the first electrode 12. This state is shown as an inverted position from an actual coating state.

The copper power injected from the nozzle 34 is sprayed on the surface of the first electrode 12 in a perpendicular direction thereto. The copper powder sprayed to the vicinity of the frame opening 382 enters along the slant surface according to involution effect. Accordingly, the copper powder spreads along the slant surface of the frame opening 382, forming the block electrode 14 having the wider surface 141 on the first electrode 12 side and the narrow surface 142 on the opposite side (a lower side in FIG. 3). The block electrode 14 integrally formed with the first electrode 12 is used as a part of the semiconductor device as shown in FIG. 1. The block electrode 14 of the present embodiment may also be coated by use of the masking plate 38 having the frame opening 381 as shown in FIG. 2. Specifically, the masking plate 38 is placed at a distance from the first electrode 12, so that sprayed copper powder goes under the masking plate 38, thereby forming the block electrode 14 having a slant side surface.

During use, the semiconductor device 1 shown in FIG. 1 is placed between heat exchangers not shown so that the heat exchangers contact the first electrode 12 and the second electrode 13 from above and below. Accordingly, the heat generated by the semiconductor element 11 is transferred to the heat exchangers through the first electrode 12 and the second electrode 13 and dissipated therefrom. At that time, heat dissipation from the first electrode 12 side is performed by direct heat transfer from the block electrode 14 to the first electrode 12, even though the solder layer 15 is present. According to the semiconductor device 1, consequently, no disturbance of heat dissipation is caused by the solder layer between the block electrode 14 and the first electrode 12. The heat dissipation property can therefore be improved by just that much.

The block electrode 14 is formed with the wide surface 141 on the first electrode 12 side and the narrow surface 142 on the solder layer 15 side to be wider in a direction in which heat is transferred. This provides an increased heat-dissipating area, achieving improved heat dissipation property. Owing to a pyramid shape wider than the rectangular parallelepiped block electrode, the block electrode 14 has a larger volume by just that much and hence has a larger heat capacity. Thus, the block electrode 14 can provide enhanced transitional heat-absorbing ability. For instance, when the angle θ of the side surface of the block electrode 14 is set to about 45°, the wide surface 141 has an area magnified in horizontal and vertical size than the narrow surface 142 according to the thickness of the block electrode 14. The heat dissipation property can be enhanced by just that much.

For providing the configuration with no solder layer as in the present embodiment, it is conceivable to integrally form the first electrode 12 and the block electrode 14 by forging. In the forging, however, the flatness of an opposite surface of the first electrode 12 from the surface formed with a block electrode may be deteriorated, which may generate a gap between a contact surface of the semiconductor device 1 which contacts with a heat exchanger not shown, thus resulting in decreased heat dissipation property. In this regard, the present embodiment in which the first electrode 12 is formed of a plate material having high flatness does not cause such a problem. Because of the characteristics of a cold spray layer or film, a capillary phenomenon comes about in respective surfaces due to their irregularities. Therefore, the solder layer 15 between the block electrode 14 and the semiconductor element 11 can prevent failure caused by wet-spreading of solder due to such capillary phenomenon during soldering. Furthermore, the block electrode 14 made of copper is able to be applied with nickel plating or metal plating as with the nickel or metal plating to the first electrode 12.

Second Embodiment

Figure 4:
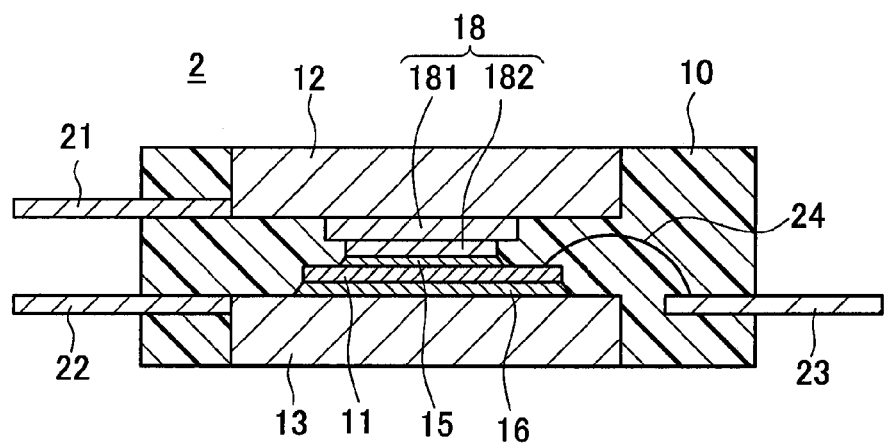
FIG. 4 is a sectional view of a semiconductor device in a second embodiment.

Next, FIG. 4 is a sectional view of a semiconductor device of a second embodiment. Similar or identical parts to those in the first embodiment are explained with the same reference signs as those in the first embodiment. This semiconductor device 2 is configured such that the semiconductor element 11 is held between the first electrode 12 and the second electrode 13 and further a block electrode 18 is held between the semiconductor element 11 and the second electrode 12. In the present embodiment, similarly, the block electrode 18 is coated on the first electrode 12 by the cold spray method. Thus, no solder layer is present between the first electrode 12 and the block electrode 18.

The semiconductor element 11 is joined to the second electrode 13 and the block electrode 18 through the solder layers 16 and 15, respectively. The first electrode 12 and the second electrode 13 are connected respectively to the main electrode terminals 21 and 22. The control electrode terminal 23 is connected to the semiconductor element 11 through the bonding wire 24. Those components are wholly molded with resin 10. The block electrode 18 is one example of the intermediate layer recited in claims.

Figure 5:
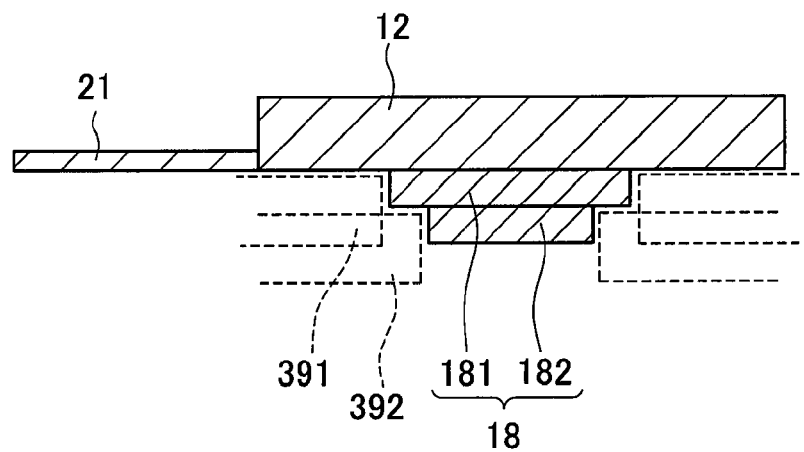
FIG. 5 is a sectional view of a first electrode and a block electrode of the semiconductor device in the second embodiment.

The block electrode 18 is formed stepwise in such a manner as shown in FIG. 5. For the two-layered block electrode 18, two masking plates 391 and 392 indicated by broken lines are used according to respective layers. This state is shown as an inverted position from an actual coating state. The masking plate 391 with a wider frame opening is first disposed. Copper powder is sprayed from the nozzle 34 to form a first block 181 on the first electrode 12. Subsequently, the masking plate 391 is replaced with the masking plate 392 with a narrow frame opening, and similarly copper powder is sprayed from the nozzle 34 to form a second block 182 having a smaller area on the first block 181. In this way, the two-layered block electrode 18 is formed and thus used, integrally with the first electrode 12, as a part of the semiconductor device 1 as shown in FIG. 1. The number of layers may be two or more. A part of the layers may be designed to have a tapered end as shown in FIG. 3.

During use, the semiconductor device 2 shown in FIG. 4 is placed between heat exchangers not shown so that the heat exchangers contact the first electrode 12 and the second electrode 13 from above and below. The heat generated by the semiconductor element 11 is transferred to the heat exchangers through the first electrode 12 and the second electrode 13 and dissipated therefrom. At that time, heat dissipation from the first electrode 12 is performed by direct heat transfer from the block electrode 18 to the first electrode 12, even though the solder layer 15 is present. According to the semiconductor device 2, consequently, no disturbance of heat dissipation is caused by the solder layer between the block electrode 18 and the first electrode 12. The heat dissipation property can therefore be improved by just that much.

The block electrode 18 is configured to have a cross sectional area becoming larger from the second block 182 to the first block 181 in the heat transferring direction. This provides an increased heat-dissipating area. The block electrode 18 has a larger volume and hence has a larger heat capacity. Thus, the block electrode 18 can provide enhanced transitional heat-absorbing ability. As in the first embodiment, furthermore, the first electrode 12 has high flatness. Therefore, the block electrode 18 formed by the cold spray can prevent failures caused by wet-spreading of solder due to such capillary phenomenon during soldering. Furthermore, the block electrode 18 made of copper may also be applied with nickel plating or metal plating as with the nickel or metal plating to the first electrode 12.

Third Embodiment

Figure 6:
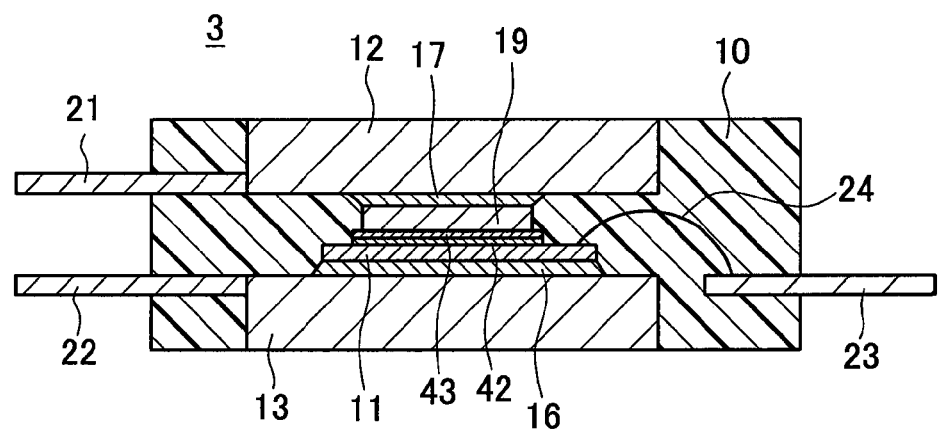
FIG. 6 is a sectional view of a semiconductor device in a third embodiment.

In the above first and second embodiments, the block electrode 14 or 18 is coated on the first electrode 12 by the cold spray method. In a third embodiment explained below, on the other hand, a block electrode is coated on a semiconductor element by the cold spray method. FIG. 6 is a sectional view of a semiconductor device of the third embodiment. Similar or identical parts to those in the first embodiment are explained with the same reference signs as those in the first embodiment.

The semiconductor device 3 is configured such that the semiconductor element 11 is held between the first electrode 12 and the second electrode 13 and further a block electrode 19 is held between the semiconductor element 11 and the first electrode 12. The block electrode 19 is formed by the cold spray method, but integrally with the semiconductor element 11 in the present embodiment. Accordingly, no solder layer is present between the semiconductor element 11 and the block electrode 19.

The semiconductor element 11 is joined to the second electrode 13 through the solder layer 16 provided between them. The block electrode 19 is joined to the first electrode 12 through the solder layer 17 provided between them. The first electrode 12 and the second electrode 13 are connected respectively to the main electrode terminals 21 and 22. The control electrode terminal 23 is connected to the semiconductor element 11 through the bonding wire 24. Those components are wholly molded with resin 10. The block electrode 19 is one example of the intermediate layer recited in claims.

Figure 7:
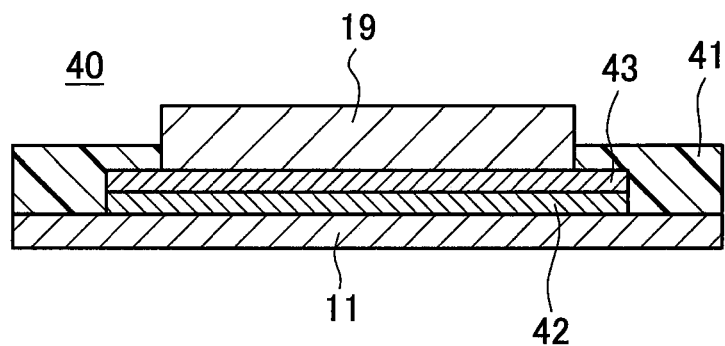
FIG. 7 is a sectional view of a semiconductor element and a block electrode of the semiconductor device in the third embodiment.

When the block electrode 19 is to be formed on the semiconductor element 11 by the cold spray method, an outer circumferential region of the semiconductor element 11 includes a region for providing insulation between the center and the outer circumference of the element, it is necessary to prevent the region from being formed by the cold spray. It is further necessary to prevent the semiconductor element 11 from being broken by shocks of the sprayed copper powder. The semiconductor element 11 is therefore provided, as shown in FIG. 7, with a protective film or layer 41 for keeping the outer circumferential portion uncoated with copper powder and two-layered metal films or layers 42 and 43 placed inside the protective layer 41 to protect the semiconductor element 11 from shocks during coating of the block electrode 19.

The protective layer 41 is made of, for example, an organic material such as polyimide resin, polyamide resin, epoxy resin, silicon resin, and a resist agent or an inorganic insulating material such as $SiO_2$ layer, $SiN_X$ layer, $TiO_2$ layer, and $Al_2O_3$ layer. In particular, the inorganic insulating material such as $SiO_2$ layer that is harder than copper powder to be sprayed thereon is more preferable. However, the organic material such as polyimide resin is also preferable as long as it has a sufficient thickness. The protective layer 41 made of such a material is formed by spin-coating, dispensing, brushing, CVD or spattering, vapor-depositing, ion-plating, or the like.

The metal layers 42 and 43 have to be made of a material having heat conductivity and electric conductivity. Further, the metal layer 42 serves to protect the semiconductor element 11 from shocks by cold spray and the metal layer 43 serves to provide a surface on which the block electrode 19 can be formed by the cold spray method. The metal layer 42 is therefore made of a material harder than the copper powder to be sprayed thereon. To be concrete, the material may be selected from titanium, zirconium, molybdenum, tungsten, manganese, cobalt, rhodium, iridium, germanium, and so on. On the other hand, the metal layer 43 is made of copper or aluminum so as to enable coating of the sprayed copper powder thereon.

The metal layers 42 and 43 are formed in this order on the semiconductor element 11 and further the protective layer 41 is formed to cover the peripheral edge portion of the metal layers 42 and 43. The semiconductor element 11 is then subjected to coating of the block electrode 19 by the coating device 30 shown in FIG. 2 in the same manner as in the first embodiment. Copper powder from the nozzle 34 is sprayed on the metal plate 43. The nozzle 34 is horizontally moved within a frame of the protective layer 41. This movement is repeated while the copper powder is sprayed, so that the block electrode 19 with a thickness of about 0.5 mm to 2 mm is formed. The protective layer 41 may be left without being removed after the cold spray process so that it is integral with the semiconductor element 11 as a product to be shipped. Alternatively, the protective layer 41 may be used only during cold spray process and then removed by etching using a chemical or reactive gas after coating of the block electrode 19.

The semiconductor device 3 shown in FIG. 6 is also placed between heat exchangers not shown during use so that the heat exchangers contact the first electrode 12 and the second electrode 13 from above and below. The heat generated by the semiconductor element 11 is transferred to the heat exchangers through the first electrode 12 and the second electrode 13 and dissipated therefrom. At that time, heat dissipation from the first electrode 12 side is performed by direct heat transfer from the semiconductor element 11 to the block electrode 19, not through solder, even though the solder layer 17 is present. According to the semiconductor device 3, therefore, disturbance by the solder layer does not act on between the semiconductor element 11 and the block electrode 19 and thus the heat dissipation property can be enhanced by just that much. As in the first embodiment, the block electrode 19 which is a cold spray layer can prevent failures caused by wet-spreading of solder due to such capillary phenomenon during soldering. Furthermore, the block electrode 19 made of copper can also be applied with nickel plating or metal plating as with the nickel or metal plating to the first electrode 12.

An element member 40 shown in FIG. 7 is produced in such a manner that a plurality of element members are coated on a wafer and then they are cut apart per one semiconductor element 11. At that time, the semiconductor element 11 being low in strength needs caution to prevent breakage. In the element member 40, however, the semiconductor element 11 is covered with the rigid cold spray layer (the block electrode 19) or the like and increased in strength. Therefore, it is possible to easily process the semiconductor element 11 without breakage and enhance yields and productivity. The semiconductor element 11 also needs to be subjected to an electric current test in which the semiconductor element 11 is applied with an electric current through a test probe placed in contact therewith. Conventionally, the current probe is placed in direct contact with the semiconductor element 11 and thus carefulness is required to avoid damage to the semiconductor element 11. The probe is therefore apt to insufficiently contact with the semiconductor element 11. This test would be difficult to supply a large current to the semiconductor element 11. According to the element member 40, however, the semiconductor element 11 is covered with the strong block electrode 19 having the electric conductivity and others and therefore the semiconductor element 11 is free from any fear of damage by the current probe. The current test using a large current is enabled.

Fourth Embodiment

The first through third embodiments show the configurations omitting the solder layer to improve the heat dissipation effect. The following embodiment shows a configuration including the solder layer to improve the heat dissipation effect. In the semiconductor device 1 shown in FIG. 1, the semiconductor element 11 and the second electrode 13 are joined through the solder layer 16. The silicon constituting the semiconductor element 11 and the copper constituting the second electrode 13 are different in coefficient of linear (thermal) expansion; the silicon is about 2 ppm/° C. and the copper is about 17 ppm/° C. Accordingly, in the solder layer 16 joining the semiconductor element 11 and the second electrode 13, shear stress is caused by thermal shocks, which may cause fatigue failure. Thus, the solder layer 16 needs to have a thickness of a fixed value (about 100 μm) or more so as to disperse the stress.

On the other hand, the solder constituting the solder layer 16 consists primary of tin (Sn) and thus has low thermal conductivity. The solder layer 16 is therefore desired to have a thin thickness with the object of decreasing thermal resistance, but a predetermined thickness or more is needed to prevent the fatigue failure as mentioned above. Such a thick thickness will deteriorate the heat dissipation property. Furthermore, there is conventionally known a configuration that an aluminum wire bond is embedded in a layer in order to ensure the thickness of the solder layer 16. However, the aluminum cannot be bonded to the tin which is a primary component of the solder. The wire bond is thus present as a foreign matter in the solder layer 16 and may cause a problem with fatigue failure due to heat stress and the like.

Figure 8:
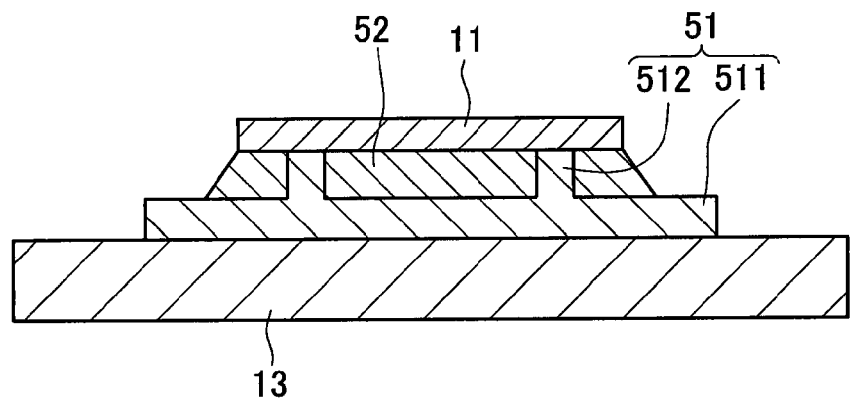
FIG. 8 is an enlarged side sectional view showing a configuration including a semiconductor element to a second electrode of a semiconductor device in a fourth embodiment.
Figure 9:
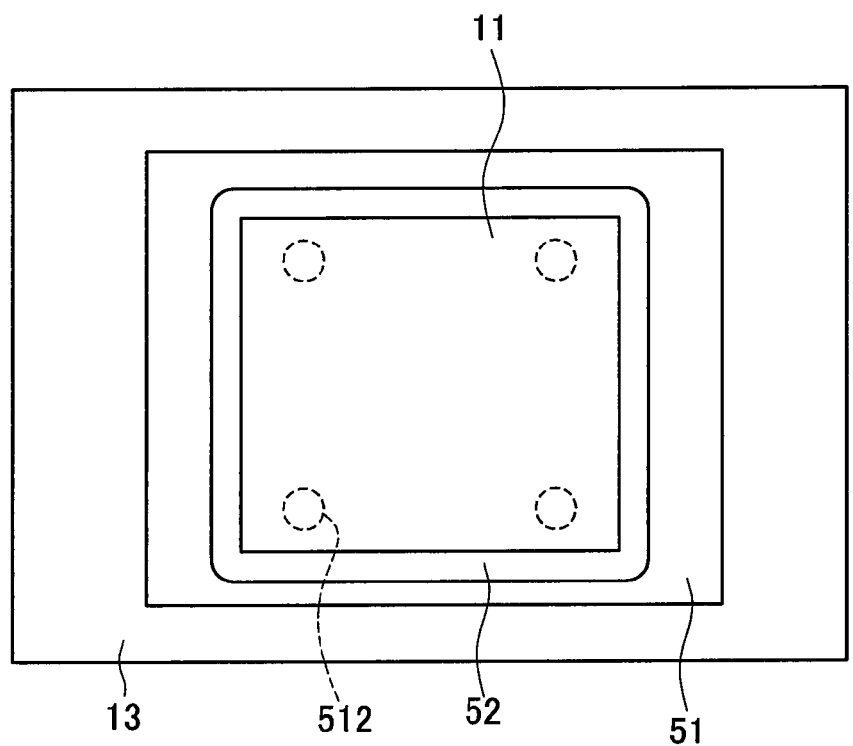
FIG. 9 is a plan view of the configuration of FIG. 8 seen from above.

The fourth embodiment shows a semiconductor device provided with a solder layer integral with a cold spray layer between the semiconductor element 11 and the second electrode 13. The semiconductor device of this embodiment has a configuration instead of the solder layer 16 of the semiconductor device 1 shown in FIG. 1. Therefore, the overall view of the semiconductor device is omitted and only the characteristic parts are illustrated and explained below. FIG. 8 is an enlarged side sectional view showing a configuration including the semiconductor element 11 to the second electrode 13 of the semiconductor device of the present embodiment. FIG. 9 is a plan view of the configuration of FIG. 8, seen from above.

In the present embodiment, a support block 51 is formed on the second electrode 13, and the semiconductor element 11 is joined thereto through a solder layer 52 provided on the support block 51. A cold spray method is used to form this support block 51. This support block 51 is one example of the intermediate layer recited in claims.

The support block 51 has a larger area than the semiconductor element 11 and includes four protrusions 512 arranged near the corners of the semiconductor element 11. Specifically, the support block 51 is made in such a manner that a rectangular flat plate portion 511 excepting the protrusions 512 is first made and then the protrusions 512 are formed. The support block 51 is formed by coating using the cold spray device shown in FIG. 2. A masking plate corresponding to the flat plate portion 511 is first prepared. Copper powder is sprayed from the nozzle 34 onto the second electrode 13. Thereafter, a masking plate corresponding to the protrusions 512 is prepared and copper powder is sprayed from the nozzle 34 onto the flat plate portion 511.

The support block 51 with the protrusions 512 is formed in the above way, and the semiconductor element 11 is joined onto the support block 51 through the solder layer 52. Each of the protrusions 512 having a columnar shape has a height of approximately 100 to 400 μm corresponding to the thickness of the solder layer 52 and a diameter of approximately 0.01 to 1 mm. The semiconductor element 11 as being held in contact with the end surfaces of the protrusions 512 is joined thereto by the solder layer 52. The configuration on the semiconductor element 11 is similar to that shown in FIG. 1 and they are entirely molded with resin 10.

In the semiconductor device of the present embodiment, the support block 51 coated on the second electrode 13 is in contact with the semiconductor element 11, so that the heat dissipation property is higher than the case where only the solder layer 52 is provided. This is because the support block 51 made of copper provides a larger heat capacity and a higher heat absorbing effect than tin which is a component of solder. As an alternative, the support block 51 may be made of gold or silver, which are a high heat conductive material, as well as copper.

The support block 51 with the protrusions 512 can provide the enhanced heat dissipation property and also have a function of ensuring the thickness of the solder layer 52 as with a conventional aluminum wire bond. The solder layer 52 can therefore have a layer thickness enough to disperse the stress caused between the semiconductor element 1 and the support block 51 which are different in coefficient of linear (thermal) expansion and thus prevent fatigue failure.

Further, shear stress caused in the solder layer 52 by thermal shocks is largest in the outermost circumference of the semiconductor element 11 and particularly the occurrence of cracks begins with the corners. In the present embodiment, the four protrusions 512 of the support block 51 are disposed near four corners of the semiconductor element 11 to prevent flowing of solder out of the corners to ensure the layer thickness, thus preventing the occurrence of cracks that likely begins with the corners. Furthermore, the solder is good at joining to the copper support block 51 and thus it is less likely to become a starting point of fatigue failure as caused in the conventional aluminum wire bond. From this point of view, the protrusions 512 are preferably formed in columnar shape but not limited thereto. The protrusions 512 may be of a rectangular columnar shape considering the heat dissipation.

Fifth Embodiment

Figure 10:
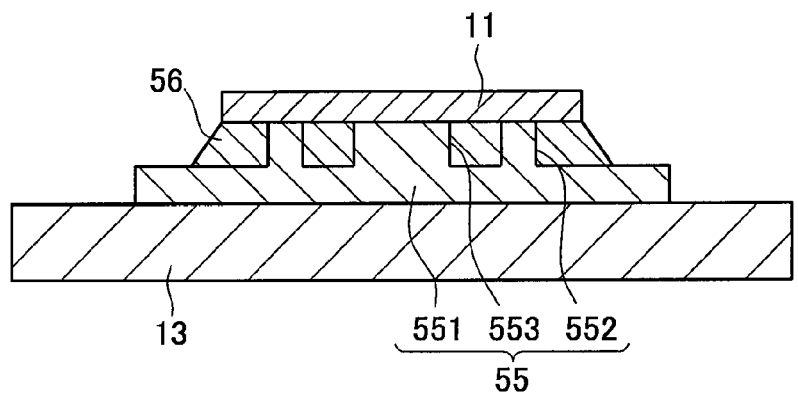
FIG. 10 is an enlarged side sectional view showing a configuration including a semiconductor element to a second electrode of a semiconductor device in a fifth embodiment.
Figure 11:
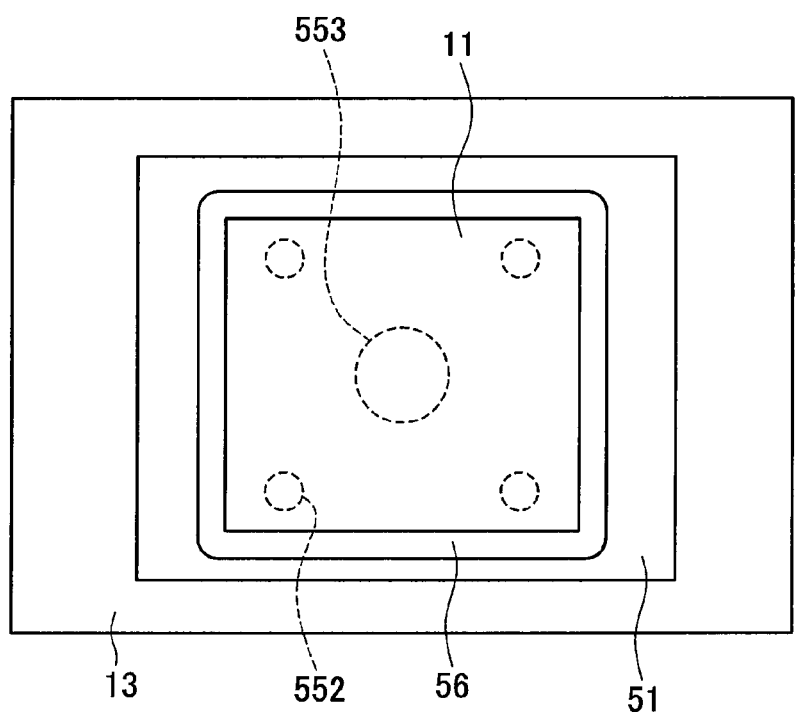
FIG. 11 is a plan view of the configuration of FIG. 10 seen from above.

A fifth embodiment is explained below as a modified example of the above fourth embodiment. A semiconductor device of this embodiment has a configuration instead of the solder layer 16 of the semiconductor device 1 shown in FIG. 1. Therefore, the overall view of the device is omitted and only the characteristic parts are illustrated and explained below. FIG. 10 is an enlarged side sectional view showing a configuration including the semiconductor element 11 to the second electrode 13. FIG. 11 is a plan view of the configuration of FIG. 10, seen from above.

The semiconductor device of the present embodiment uses a support block 55 modified from the support block 51 of the fourth embodiment. The support block 55 is formed with a central protrusion 553 in addition to four protrusions 552 arranged near the corners of the semiconductor element 11 on a flat plate portion 551. This block 55 is coated on the second electrode 13 by the cold spray method. The semiconductor element 11 is joined to the support block 55 through a solder layer 56 provided on the support block 55. This support block 55 is one example of the intermediate layer recited in claims.

The support block 55 is formed in such a way that a masking plate corresponding to the flat plate portion 551 is first prepared and copper powder is sprayed from the nozzle 34 onto the second electrode 13 to form the flat plate portion 551 excepting the protrusions 552 and 553. A masking plate corresponding to the protrusions 552 and 553 is then prepared and copper powder is sprayed from the nozzle 34 onto the flat plate portion 551 to form the protrusions 552 and 553. The support block 55 may also be made as a cold spray layer of gold or silver which are a high heat conductive material, as well as copper.

The protrusions 552 and 553 each have a columnar shape with a height of about 100 to 400 μm corresponding to the thickness of the solder layer 56. The protrusions 552 each have a diameter of about 0.01 to 1 mm and the central protrusion 553 has a diameter of about 1 to 5 mm larger than the protrusions 552. The semiconductor element 11 as being in contact with the end faces of the protrusions 552 and 553 is joined to the solder layer 56. The configuration on the semiconductor element 11 is similar to that shown in FIG. 1 and they are entirely molded with resin 10.

In the semiconductor device of the present embodiment, as in the fourth embodiment, the support block 55 can provide enhanced heat dissipation property and also have the function to ensure the thickness of the solder layer 56. The solder layer 56 therefore has a layer thickness enough to disperse the stress caused between the semiconductor element 11 and the support block 55 which are different in coefficient of linear (thermal) expansion and thus prevent fatigue failure. Meanwhile, restriction of usage of the semiconductor element 11 is determined based on the temperature of a central portion which tends to generate a largest amount of heat, resulting in a highest temperature. In this regard, the support block 55 includes the protrusion 553 of a largest heat capacity at the central portion of the semiconductor element 11. According to the semiconductor device of the present embodiment, therefore, a peak temperature can be decreased by the heat dissipation of the protrusion 553, so that the usage range of the semiconductor element 11 is made wider. Furthermore, the protrusions 552 are arranged near the four corners of the semiconductor element 11 as in the fourth embodiment, this arrangement can prevent the occurrence of cracks tending to begin with the corners. In addition, the support block 55 made of copper is good at joining to solder. In this respect, similarly, fatigue failure is less likely to come about.

The semiconductor devices of the fourth and fifth embodiments shown in FIGS. 8 to 11 are formed with a plurality of the protrusions 512 or the protrusions 552 and 553 in the support block 51 or 55. As mentioned above, for avoiding the cracks at the corners, it is preferable to arrange the protrusions in the vicinity of the corners of the semiconductor element 11. However, the positions and the number of protrusions are not limited to the above ones. For example, the support block 55 may be configured to have only the protrusion 553. The fourth and fifth embodiments show the state where the protrusions 512 or the protrusions 552 and 553 are in contact with the semiconductor element 11, but the protrusions may be joined to the semiconductor element 11 by for example interposing a solder layer having a thickness of about several to several tens of micrometers (μm). The support block 51 or 55 is thus joined to the semiconductor element 11 without loss of heat conductivity and electric conductivity.

Figure 12:
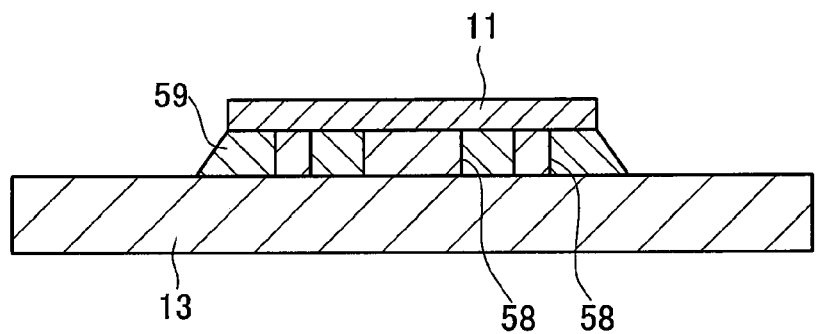
FIG. 12 shows a modified example of the fifth embodiment.

It is conceivable that the support block 51 or 55 having the protrusions 512 or the protrusions 552 and 553 are made by an evaporation method, a spattering method, a plating method as well as the aforementioned cold spray method. However, the evaporation method and the spattering method are very low in a coating speed and poor in yield percentage of materials. This results in a very expensive product. Further, the plating method is also slow in a coating speed, resulting in an expensive product, and cannot form a uniform-quality and high-purity layer or film with a thickness of several hundred micrometers. Consequently, it is preferable to form the support blocks 51 and 55 by the cold spray method. In this case, the fourth and fifth embodiments show the support blocks 51 and 55 shaped to include the flat plate portions 511 and 551 respectively. It also may be arranged to form only protrusions 58 in a solder layer 59 on the second electrode 13, as shown in FIG. 12.

Sixth Embodiment

Figure 13:
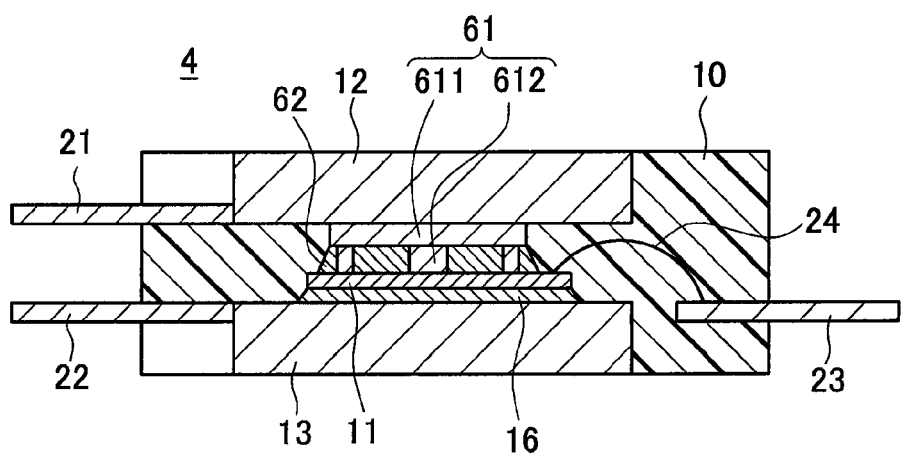
FIG. 13 is a sectional view of a semiconductor device of a sixth embodiment.

The fourth and fifth embodiments explain that the support block 51 and others are formed on the second electrode 13. It is further preferable to provide the configuration including the support block 51 and others in the solder layer between the semiconductor element 11 and the first electrode 12 and further the protrusions are formed in the block electrode placed between the semiconductor element 11 and the first electrode 12. FIG. 13 is a sectional view of a semiconductor device of the sixth embodiment, in which similar or identical parts to those in the first embodiment are shown with the same reference signs as those in the first embodiment.

This semiconductor device 4 is configured such that the semiconductor element 11 is held between the first electrode 12 and the second electrode 13 and further a protrusion-formed block electrode 61 is held between the semiconductor element 11 and the first electrode 12. This block electrode 61 is formed on the first electrode 12 by the cold spray method as in the first embodiment as shown in FIG. 1. At that time, as in the fourth and fifth embodiments, a rectangular flat plate portion 611 excepting protrusions 612 is formed and then the protrusions 612 are formed. No solder layer is present between the first electrode 12 and the block electrode 61. The semiconductor element 11 is joined to the block electrode 61 through a solder layer 62 provided under the block electrode 61. It is to be noted that the protrusion-formed block electrode 61 is one example of the intermediate layer recited in claims.

The semiconductor element 11 is joined to the second electrode 13 and the protrusion-formed block electrode 61 respectively through the solder layers 16 and 62. The first electrode 12 and the second electrode 13 are connected respectively to the main electrode terminals 21 and 22 and the control electrode terminal 23 is connected to the semiconductor element 11 through the bonding wire 24. In addition, the whole components are molded with resin 10.

In the semiconductor device 4 of the present embodiment, the protrusion-formed block electrode 61 can enhance heat dissipation property and serve to ensure the thickness of the solder layer 62. Accordingly, the solder layer 62 has a layer thickness enough to disperse the stress caused between the semiconductor element 11 and the block electrode 61 which are different in coefficient of linear (thermal) expansion and thus prevent fatigue failure. Further, the support block 61 made of copper is good at joining to solder. In this respect, similarly, fatigue failure is less likely to come about.

Seventh Embodiment

Figure 14:
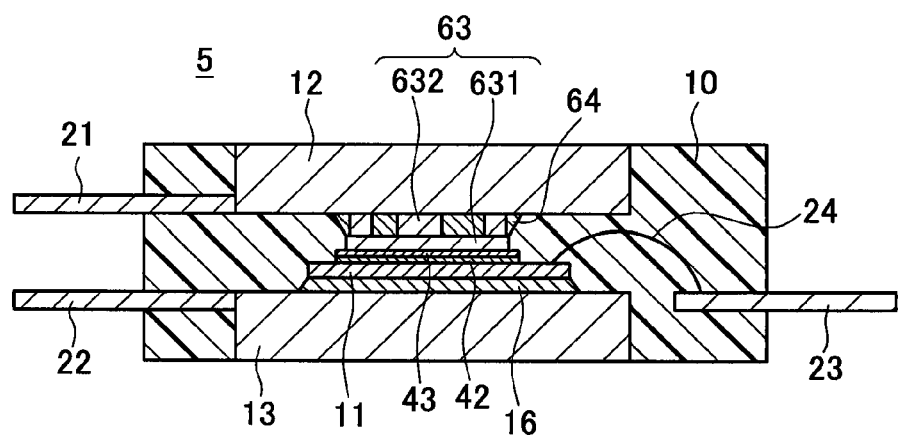
FIG. 14 is a sectional view of a semiconductor device in a seventh embodiment.
Figure 15:
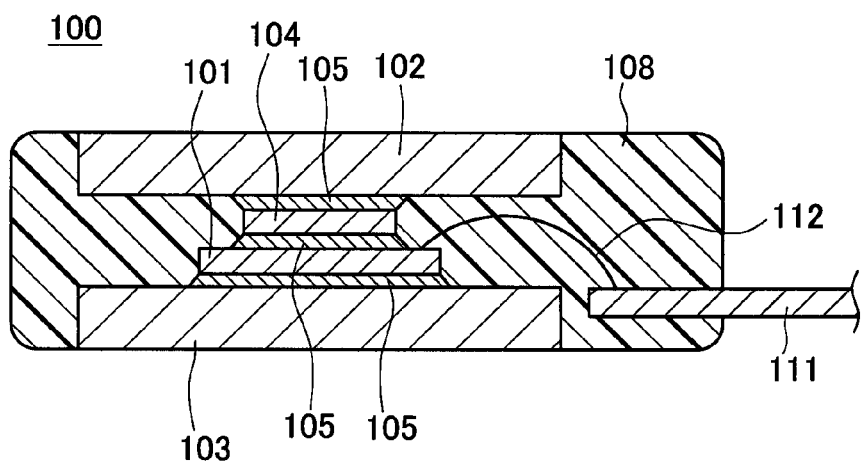
FIG. 15 is a sectional view of a conventional semiconductor device.

A seventh embodiment shows, as the above sixth embodiment, that protrusions are formed in a block electrode between the semiconductor element 11 and the first electrode 12. FIG. 14 is a sectional view of a semiconductor device of the seventh embodiment, in which similar or identical parts to those in the first embodiment are explained with the same reference signs as those in the first embodiment. A semiconductor device 5 is configured such that the semiconductor element 11 is held between the first electrode 12 and the second electrode 13 and further a protrusion-formed block electrode 63 is held between the semiconductor element 11 and the first electrode 12.

The metal layers 42 and 43 are placed on the surface of the semiconductor element 11 as in the third embodiment shown in FIGS. 6 and 7, and further the protrusion-formed block electrode 63 is formed on the metal layers 42 and 43 by the cold spray method with respect to the first electrode 12. At that time, as in the fourth and fifth embodiments, a rectangular flat plate portion 631 excepting protrusions 632 is formed and then the protrusions 632 are formed. No solder layer is present between the semiconductor element 11 and the protrusion-formed block electrode 63. The first electrode 12 is then joined through a solder layer 64 provided on the block electrode 63. This protrusion-formed block electrode 63 is one example of the intermediate layer recited in claims.

The semiconductor element 11 is joined to the second electrode 13 by the solder layer 16 and to the first electrode 12 through the protrusion-formed block electrode 63 by the solder layer 64. The first electrode 12 and the second electrode 13 are connected respectively to the main electrode terminals 21 and 22 and the control electrode terminal 23 is connected to the semiconductor element 11 through the bonding wire 24. In addition, the whole components are molded with resin 10. In the semiconductor device 5 of the present embodiment, the protrusion-formed block electrode 63 allows the heat to be transferred to the first electrode 12 through the protrusions 632, and thus the heat dissipation property can be more enhanced.

The semiconductor devices according to the present invention are exemplified in the above embodiments but not limited thereto. The present invention may be embodied in other specific forms without departing from the essential characteristics thereof.

For instance, the above embodiments exemplify the semiconductor device with electrodes on both sides, but may adopt a semiconductor device with an electrode on one side as shown in FIGS. 8 to 11.

DESCRIPTION OF THE REFERENCE SIGNS

1 Semiconductor device
10 Resin
11 Semiconductor element
12 First electrode
13 Second electrode
14 Block electrode
15, 16 Solder layer

The invention claimed is:

1. A method for manufacturing a semiconductor device in which a semiconductor element, a first electrode and a second electrode placed holding the semiconductor element from both sides, the first and second electrodes functioning as heat dissipating plates, and a block electrode placed between the semiconductor element and the first electrode are molded with resin,
wherein the block electrode is integrally formed with one of the semiconductor device and the first electrode, and the block electrode is joined through solder to the other one of the first electrode and the block electrode, the other one being formed with no block electrode,
the method includes the steps of:
spraying metal powder onto the semiconductor element or the first electrode by a cold spray method to form the block electrode integrally with the one of the semiconductor element and the first electrode; and
joining the block electrode to the other one of the first electrode and the semiconductor element through solder.

2. The method for manufacturing a semiconductor device according to claim 1, wherein the block electrode is coated on the first electrode to have a sectional area becoming wider toward the first electrode.

3. The method for manufacturing a semiconductor device according to claim 1, wherein the block electrode is coated on the first electrode to have a sectional area becoming continuously or stepwise wider toward the first electrode.

4. The method for manufacturing a semiconductor device according to claim 1, the semiconductor device including a support block formed integrally with the second electrode and a solder layer joining the semiconductor element to the support block integral with the second electrode,
wherein the method includes the steps of:
spraying metal powder on the second electrode by the cold spray method to form the support block integrally with the second electrode; and
joining the semiconductor element through the solder layer to the support block integral with the second electrode,
the support block including one protrusion or two or more protrusions, each having a columnar shape, entirely embedded in the solder layer.

5. The method for manufacturing a semiconductor device according to claim 4, wherein the support block includes a flat plate portion formed in a flat plate shape and the protrusion or protrusions protruding from the flat plate portion, and the solder layer is provided between the flat plate portion and the semiconductor element.

6. The method for manufacturing a semiconductor device according to claim 5, wherein the protrusion or the protrusions of the support block include the protrusions arranged respectively near the corners of the semiconductor element.

7. The method for manufacturing a semiconductor device according to claim 6, wherein the protrusion or the protrusions of the support block include the protrusions arranged at the central portion of the semiconductor element.

8. The method for manufacturing a semiconductor device according to claim 7, wherein the support block is configured such that the protrusion arranged at the central portion of the semiconductor element is larger than the protrusions arranged near the corners.

9. The method for manufacturing a semiconductor device according to claim 1, wherein the block electrode is a protrusion-formed block electrode including one columnar protrusion or two or more columnar protrusions so that the protrusion or protrusions are entirely provided in a solder layer joined to one of the first electrode and the semiconductor element, the one being formed with no block electrode.

10. The method for manufacturing a semiconductor device according to claim 9, wherein the protrusion-formed block electrode includes a flat plate portion formed in a flat plate shape and the protrusion or protrusions protruding from the flat plate portion, and the solder layer is provided between the flat plate portion and the semiconductor element or the first electrode.

11. The method for manufacturing a semiconductor device according to claim 10, wherein the protrusion or the protrusions of the protrusion-formed block electrode include the protrusions arranged respectively near the corners of the semiconductor element.

12. The method for manufacturing a semiconductor device according to claim 11, wherein the protrusion or the protrusions of the protrusion-formed block electrode include the protrusions arranged at the central portion of the semiconductor element.

13. A method for manufacturing a semiconductor device in which a semiconductor element and one or two heat dissipating plates placed to face one or both surfaces of the semiconductor element are molded with resin, the semiconductor device including a metal layer provided on one surface of the semiconductor element, an intermediate layer integrally formed with the metal layer, and a solder layer joining a heat dissipating plate placed to face the one surface of the semiconductor element to the intermediate layer, wherein the method includes the steps of:

providing the metal layer on the one surface of the semiconductor element;

spraying metal powder onto the metal layer by a cold spray method to form the intermediate layer integrally with the metal layer; and joining the heat dissipating plate to the intermediate layer through the solder layer.

14. The method for manufacturing a semiconductor device according to claim 13, wherein the metal layer is formed in two layers, and one layer directly contacting with the semiconductor element is made of a harder material than the powder sprayed by cold spray.

15. The method for manufacturing a semiconductor device according to claim 13, wherein the step of providing the metal layer includes providing the metal layer at a central portion of the semiconductor element, the method further includes, after the providing the metal layer but before the step of forming the intermediate layer, a step of providing a protective layer at a peripheral edge portion of the semiconductor element to prevent the powder sprayed by the cold spray method from adhering to the peripheral portion, and the step of forming the intermediate layer includes forming the intermediate layer to a portion of the metal layer excepting the protective layer on the peripheral portion.

16. A method for manufacturing a semiconductor device in which a semiconductor element and one or two heat dissipating plates placed to face one or both surfaces of the semiconductor element are molded with resin, the semiconductor device including an intermediate layer integrally formed with a heat dissipating plate placed to face one surface of the semiconductor element and a solder layer joining the semiconductor element to the intermediate layer integral with the heat dissipating plate, the method includes the steps of:

spraying metal powder onto the heat dissipating plate by a cold spray method to form the intermediate layer integrally with the heat dissipating plate; and joining the semiconductor element through the solder layer to the intermediate layer integral with the heat dissipating plate, the intermediate layer includes one protrusion or two or more protrusions, each being of a columnar shape extending toward the one surface of the semiconductor element and being entirely embedded in the solder layer.

17. The method for manufacturing a semiconductor device according to claim 16, wherein the intermediate layer includes a flat plate portion formed like a flat plate on the heat dissipating plate and the protrusion or protrusions formed to protrude from the flat plate portion, and the solder layer is provided between the flat plate portion and the semiconductor element.

18. The method for manufacturing a semiconductor device according to claim 17, wherein the protrusions of the intermediate layer include the protrusions arranged respectively near the corners of the semiconductor element.

19. The method for manufacturing a semiconductor device according to claim 18, wherein the protrusions of the intermediate layer include a protrusion placed at a central portion of the semiconductor element.

20. The method for manufacturing a semiconductor device according to claim 19, wherein the intermediate layer is configured so that the protrusion placed at the central portion of the semiconductor element is larger than the protrusions placed near the corners.

* * * * *